(12) United States Patent
Srinivasan et al.

(10) Patent No.: US 8,768,654 B2
(45) Date of Patent: Jul. 1, 2014

(54) INTERACTIVE CONFIGURATION-MANAGEMENT-BASED DIAGRAMMING TOOL

(75) Inventors: Krishnan Srinivasan, Plano, TX (US); Narinder Nayar, Troy, MI (US); Girish Kandi, Pune (IN); Vinayak Pharande, Pune (IN); Shailesh Charati, Dharwad (IN); Manoj Vazarkar, Pune (IN); Mehul Shah, Pune (IN); Henry Lee Burks, Azle, TX (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 223 days.

(21) Appl. No.: 13/246,409

(22) Filed: Sep. 27, 2011

(65) Prior Publication Data
US 2012/0278046 A1 Nov. 1, 2012

Related U.S. Application Data

(60) Provisional application No. 61/480,836, filed on Apr. 29, 2011.

(51) Int. Cl.
*G06F 17/50* (2006.01)
(52) U.S. Cl.
CPC ........................... *G06F 17/50* (2013.01)
USPC .............................................. 703/1; 707/791

(58) Field of Classification Search
USPC .............................................. 703/1; 707/791
See application file for complete search history.

(56) References Cited

U.S. PATENT DOCUMENTS

| | | | |
|---|---|---|---|
| 7,010,544 B2 * | 3/2006 | Wallen et al. | 707/791 |
| 2005/0071135 A1 | 3/2005 | Vredenburgh et al. | |
| 2005/0203718 A1 | 9/2005 | Carek et al. | |
| 2008/0091942 A1 | 4/2008 | Glatfelter et al. | |
| 2009/0259440 A1 * | 10/2009 | Reed et al. | 703/1 |

OTHER PUBLICATIONS

Kim et al. "An object-oriented product data management"., 2009 IEEE. pp. 409-413.*
PCT International Search Report mailed Sep. 7, 2012 in connection to PCT International Application No. PCT/US2012/33175 filed Apr. 12, 2012 (3pages).
Written Opinion of the International Searching Authority dated Sep. 7, 2012 in connection with International Application No. PCT/US2012/33175.

* cited by examiner

*Primary Examiner* — Eunhee Kim

(57) ABSTRACT

Product data management systems, methods, and mediums. A method includes receiving PDM model and applying a template to the model. The method includes creating a description file based on the application of the template to the model. The method includes transferring the description file to a diagramming application. A diagram corresponding to the description file is created.

21 Claims, 3 Drawing Sheets

INTERACTIVE CONFIGURATION-MANAGEMENT-BASED DIAGRAMMING TOOL

CROSS-REFERENCE TO RELATED APPLICATION

This application claims the benefit of the filing data of U.S. Provisional Patent Application 61/480,836, filed Apr. 29, 2011, which is hereby incorporated by reference.

TECHNICAL FIELD

The present disclosure is directed, in general, to computer-aided design, visualization, and manufacturing systems ("CAD systems"), product lifecycle management ("PLM") systems, and systems that manage data for products and other items (individually and collectively, product data management ("PDM") systems).

BACKGROUND

PDM systems can provide users with helpful and intuitive views of systems, objects, topologies, and other items.

SUMMARY OF THE DISCLOSURE

Various disclosed embodiments relate to systems and methods for interactive configuration-management-based diagramming in data processing systems, and in particular in PDM systems.

Various embodiments include PDM systems, methods, and mediums. A method includes receiving a PDM model and applying a template to the model. The method includes creating a description file based on the application of the template to the model. The method includes transferring the description file to a diagramming application. A diagram corresponding to the description file is created.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Systems engineers can use PDM systems to visualize the model of the system they are developing as diagrams, and can capture various elements of the systems design and the relationships between them using a diagramming tool of the PDM system. They can further decompose their models into subsystems and relate them to various other elements within the system and save the information into the application. The model elements make up the design of the system, and they can be linked to various other elements in the system such as Requirements, Parts, etc.

As the system design evolves over a period of time, users can generate several diagrams out of the same model structure with different configuration or can create a new diagram for a given configuration.

For example, a development cycle could include a user creating a brand new diagram or populating the diagram from an initial set of elements in the application. The user then authors the model using a diagramming tool and creates more model elements and relations between the elements. The user then saves the diagrams as well as the model structure into the application. As the design continues to evolve, the user opens the model structure into a diagramming tool with various configurations to perform design analysis and tradeoff.

In various embodiments, users can also build domain-specific diagrams, such as layout diagrams for the shipping industry or functional model diagrams for aerospace companies, and stores the models in the application.

The various embodiments discussed in more detail below include improved systems and methods for an interactive configuration-management-based diagramming tool.

Figure 1:
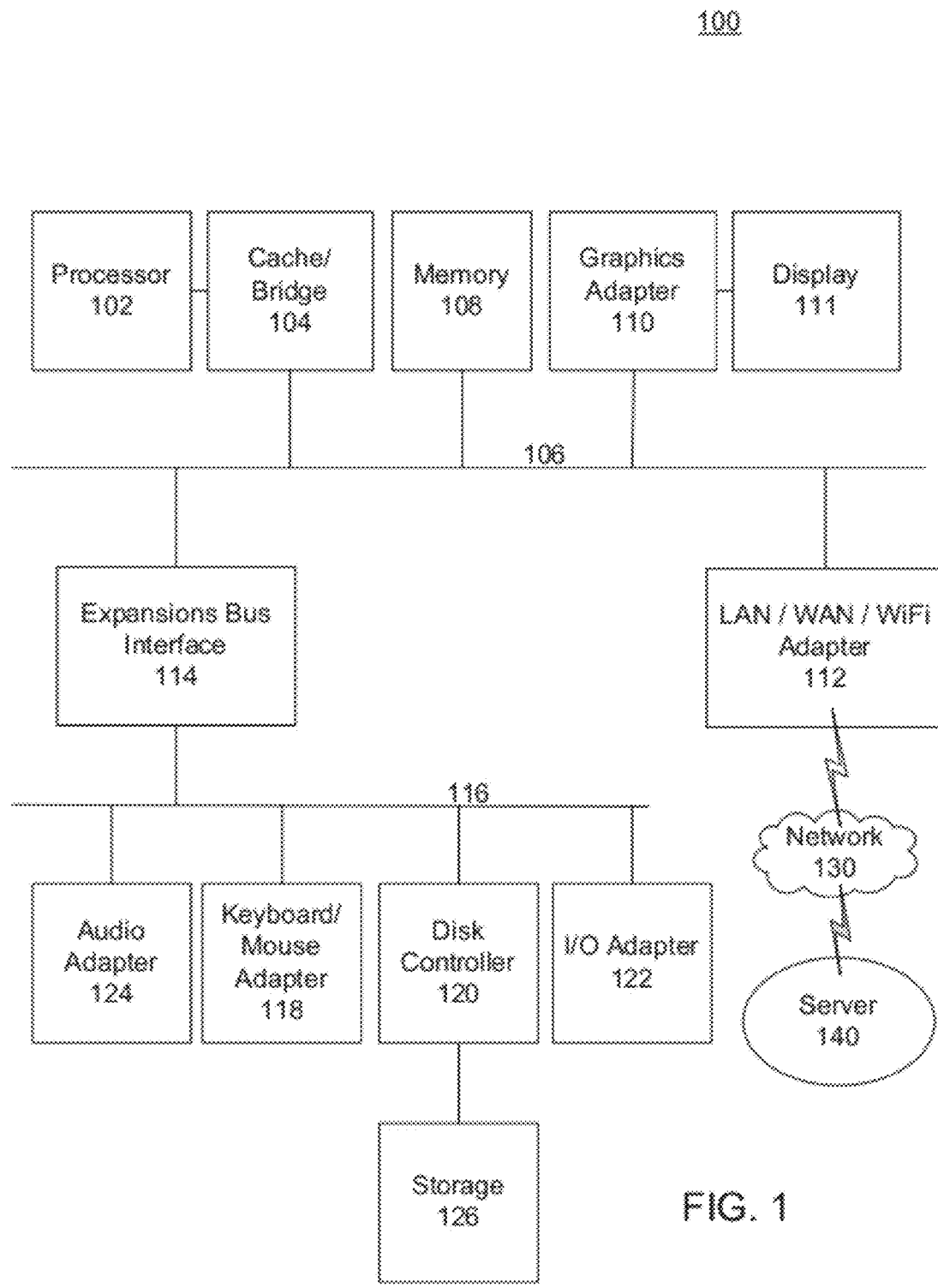
FIG. 1 depicts a block diagram of a data processing system in which an embodiment can be implemented.

FIG. 1 depicts a block diagram of a data processing system in which an embodiment can be implemented, including as a data processing system particularly configured to perform processes as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EE-PROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Various embodiments can be used in all fields where there is a need to model information using graphical applications. One diagramming application can be used in some implementations, and is discussed in the examples below, is the MICROSOFT VISIO software product.

Various embodiments include systems and methods that allow the elements in a diagram to be captured as individual model items in the application and not simply as a flat file. Each element that appears in the diagram can evolve independently of other elements in the model and each such evolution can have its own characteristics and relations to other elements in the model. Each element can have its own access control, traceability links to other elements, and version history.

So, in various embodiments, at any given point, the system can interact with a user to create a diagram from a configured model and analyze the model, interacting with a user, the system can change the configuration of the model and reflect the changes in the diagram so the user can visualize and model the system under different configurations. The configuration information of the model can be stored along with the diagram for future use. These features enable users to go back to a given configuration for analysis or traceability as a system matures.

Systems and methods disclosed herein provide a framework that includes the ability to generate and save a diagram from model elements and an application that uses the framework to open a structure of configured model elements. These model elements can be, for example, a structure of functions or logical design elements in a PDM system. The system generates the content in a format such that is compatible with integrated or separate diagramming applications. In various embodiments, the system can also interact with a user to create other kind of diagrams, including process diagrams, system block diagrams, etc.

Disclosed embodiments can include a mapping facility, such as a stencil or otherwise, that maps a given model element, such as function, to a given shape in the diagramming tool. This allows the user to define the behavior, the look, and the feel of the element when it is opened in a diagramming tool.

Various embodiments can also include a mapping mechanism that helps users to specify what properties of the model element can be seen in the diagramming application. The system provides various interfaces that an application can use to determine the behavior for various user actions such as Create, Delete, and Cut/Paste of elements from the diagramming application.

Once the diagramming application opens a model, users can create model elements in the diagrams by dragging and dropping shapes from the stencil, and the system automatically creates the corresponding objects. When users exit the diagramming tool, the system automatically parses the content of the diagram and stores the appropriate information for each shape ("fragments") in the diagram in the application. These fragments then can be re-assembled when the diagram is opened by the user again.

Once the diagram is opened, the system can configure the diagram with different configurations to show a particular revision and/or variant of a model. The system can perform an interaction with a user to display and edit the model under different configurations. Because the system can use the same diagram for many configurations, the user is provided with a familiar view of each configuration, which enables more intuitive interactions for configuration management and other purposes. Further, in cases where the same diagram is used for multiple configurations, the user can easily see the differences between configurations in a familiar diagram.

When a diagram is opened or generated for the first time, the system can display it in a default location and format, which can be configured by a user. The system can interact with a user and with the diagramming application to format each individual shape by providing fill-in color, size, outline, position, etc. The same element can have different formats on different diagrams. This unique ability gives users the ability to author and manage the data from a diagramming application within the other functions of the PDM systems.

The framework itself is independent of the diagramming tool as long as the diagramming tool provides the ability to compose and decompose the diagram from fragments. For example, MS Visio provides a XML format that can be used to decompose the diagram into XML fragments that are associated with each shape in the diagram. These XML fragments can then be reassembled to recreate the diagram.

Further, in various embodiments, the system can interactively design and manage different applications for different industries, for example a layout of machines on a factory floor.

According to various embodiments, the system generates XML data from model elements that is compatible with integrated or separate diagramming applications.

Figure 2:
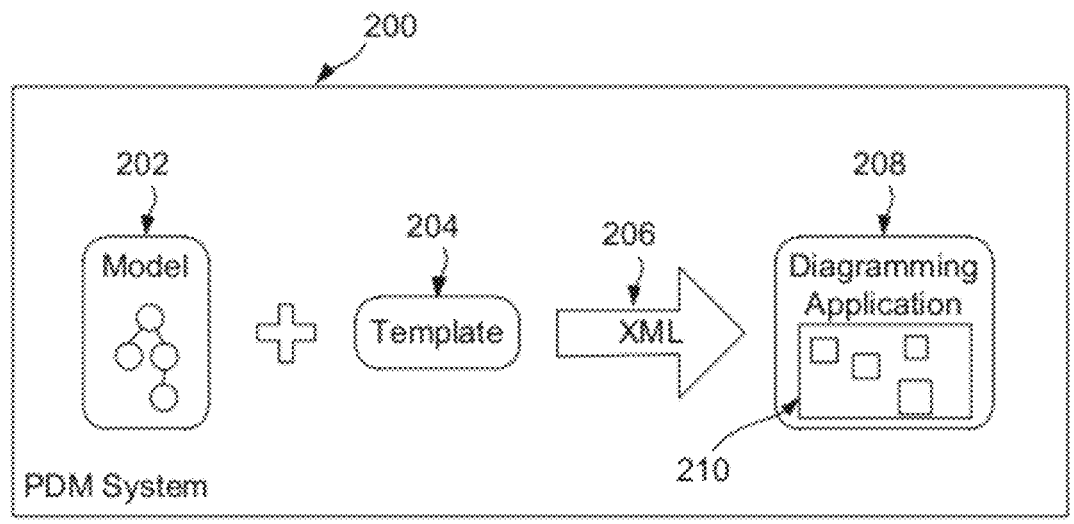
FIG. 2 illustrates a template process in accordance with disclosed embodiments.

FIG. 2 illustrates a template process in accordance with disclosed embodiments. This simplified block diagram shows a PDM system 200, which can be implemented as a data processing system 100 (and those hardware elements are not shown in this example), or a plurality of data processing system 100 acting together. Such a PDM system is also simply referred to as "the system" herein.

As illustrated in this figure, the system 200 can maintain or receive a PDM model 202, which can be, for example, a 2D or 3D CAD model or diagram or the underlying PDM data that defines such a model. A template 204 includes a stencil that maps a given type in the model 202, such as function, to a particular shape in the diagram 210 that is to be managed by diagramming application 208. The template 204 also defines a mapping between the properties of the elements of model 202 to various properties of shapes on the diagram 210. The system 200 applies a template 204 to a model 202 and generates a description file 206 which the diagramming application 208 can open to create or edit diagram 210. The description file 206, in some embodiments, is an extensible markup language (XML) file. The description file 206 is transferred to the diagramming application, which creates a corresponding diagram. The system 200 can interact with a user to rearrange the shapes of create new elements in, or otherwise edit the diagram 210; in some cases this, can include communicating user inputs to the diagramming application.

Figure 3:
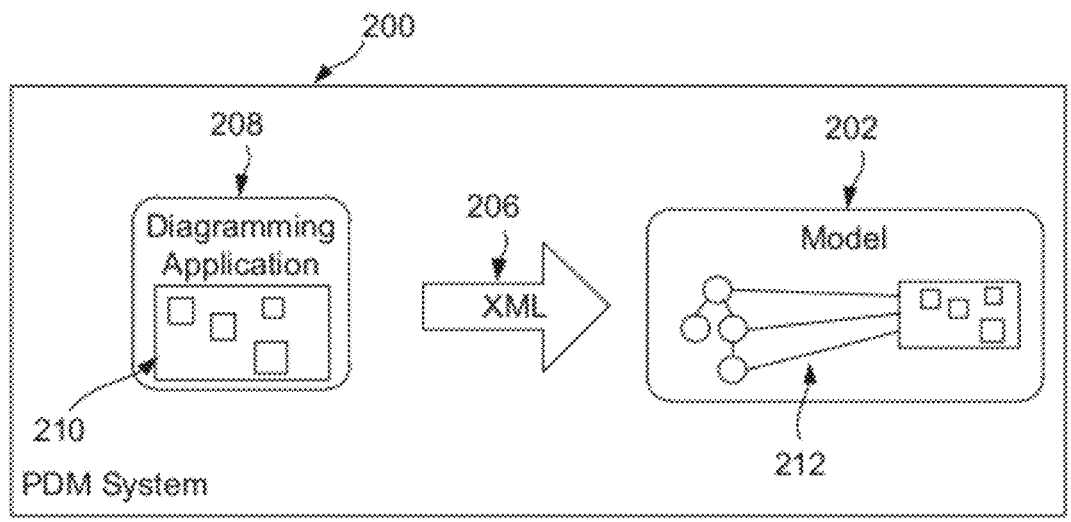
FIG. 3 illustrates a "create and save" process in accordance with disclosed embodiments.

FIG. 3 illustrates a "create and save" process in accordance with disclosed embodiments. Once the diagram 210 is opened in the diagramming application 208, the system 200 can interact with a user to create various objects and relations in the diagram 210, and to move the objects, format them, and perform other operations. When the user saves the diagram 210, the system converts the diagram to a description file 206 which is parsed to determine fragments 212 that correspond to various objects of the diagram 210; these fragments can be stored along with the model 202.

In a specific implementation in accordance with disclosed embodiments, the MICROSOFT VISIO® software application can be used as the diagramming application 208 for such a creation process. When the system receives a user input such as a drag/drop of a "master shape" for that software application for which mapping is defined, to drag and drop that "master shape" from a stencil to a page of that software application, the system can perform several steps in response.

The system can read shape type and property mapping information from the mapping file. The system can read a property mapping file to get the default values of any mandatory properties. If the mandatory properties are not defined then the system can interactively define the properties with the user to create the object and add it to the diagramming application page. If all of the mandatory properties are defined in property mapping file, the system can create the object in a database. On successful creation of the object, the system populates the mapped shape properties values from the PDM system property values.

The system can also perform an "open with configuration" process in accordance with disclosed embodiments. Upon receiving an input from a user, the system 200 can open a saved model 212 or diagram 210, at which time a configuration of the model 212 can be specified, including such information as the released version of the elements or the working version of the elements. The system 200 searches the appropriate version of each element and collects the previously-stored corresponding fragments 212. The system uses the fragments 212 to create a file 206 that can be opened in the diagramming application 208. This process allows users to create and open the diagram 210 with various configurations of the model.

This function, along with other processes described herein, provides a distinct technical advantage in interactive configuration management. Where a given product or assembly may have several different configurations stored, and different versions of those configurations, the system enables a user to select any of those configurations and automatically assembles and opens a file that reflects that configuration, based on the fragments 212. This allows users to quickly and intuitively open a given configuration in a diagramming application, for either visualization or for further modification. Modifications to a configuration can then be saved as a new configuration or version, and the system will store the fragments 212 as described herein so that the new configuration can be recalled when needed.

In a specific implementation in accordance with disclosed embodiments, the MICROSOFT VISIO® software application can be used as the diagramming application 208 for such an "open" process. Upon receiving a user input to open a model or diagram, the system can perform several actions in response.

The system can determine all objects that are to be represented on a diagram. This step can include querying a database to determine all Objects that satisfy the criteria given by a membership rule object.

The system finds which shape represents each object. This step can include parsing a diagram template file and a property map. With the information in these, the system can create a map of shape criteria to shape XML such that, given an object to put into the diagram, its associated shape XML can be determined.

In the case of relations, the system can determine which connector shape is referenced and the two objects to which it points.

The system can insert the shapes into a blank or skeleton diagram. This process can include parsing the shapes into a base or skeleton diagram and writing out part of it into a new diagram. The system can then iterate through the list of included objects, find the shape XML for each, and write each into the new diagram. Finally, the system can continue parsing the skeleton and writing its remaining contents into the new diagram. For those objects that were already on the diagram and have shape XML from a previous save step, the shape XML can be copied from them and not gotten from the template/map.

In other embodiments, the system can store the entire diagram as a flat file and can store the diagram for a particular configuration of the model. As the number of configurations increases, it becomes more difficult to manage the number of diagrams in such cases.

Figure 4:
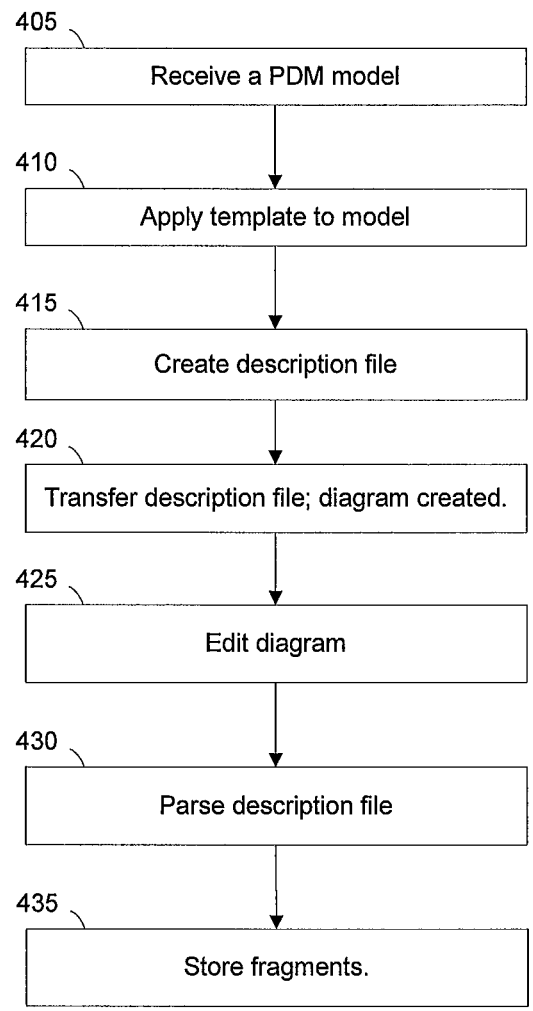
FIG. 4 depicts a flowchart of a process in accordance with disclosed embodiments.

FIG. 4 depicts a flowchart of a process in accordance with disclosed embodiments. This process can be performed, for example, by one or more PDM data processing systems configured to perform acts described below, and can be implemented by executable instructions stored in a non-transitory computer-readable medium that cause one or more PDM data processing systems to perform such a process.

The system receives a PDM model (step 405). "Receiving", as used herein, can include loading from storage, receiving from another system or process, receiving via an interaction with a user, otherwise. In some embodiments, this step can include receiving a prior diagram and creating a new PDM model from the diagram.

The system applies a template to the model (step 410). The template can include a stencil that maps a given type in the model, such as function, to a particular shape in the diagram discussed below. The template can define a. mapping between the properties of elements of model to various properties of shapes on the diagram.

The system creates a description file based on the application of the template to the model (step 415). The description file can be an XML file.

The system transfers the description file to a diagramming application (step 420), and a diagram corresponding to the description file is created.

The system can interact with a user to edit the diagram (step 425). This can include rearranging shapes of the diagram or creating new elements in the diagram.

The system can parse the description file to determine fragments that correspond to one or more objects of the diagram (step 430). The description file can be re-created from the diagram when a user saves the diagram.

The system can store the fragments with the model (step 435). The system can reassemble the fragments to recreate the diagram.

In various embodiments, the system can also interact with users to construct or create PDM models from the diagramming application.

Unless otherwise described, the various processes, actions, and steps described above can be performed concurrently, sequentially, in a different order, or omitted or combined in various embodiments.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method performed by a product data management (PDM) data processing system, comprising:
   receiving a PDM model;
   applying a template to the model;
   creating a description file based on the application of the template to the model; and
   transferring the description file to a diagramming application, wherein a diagram corresponding to the description file is created.

2. The method of claim 1, wherein the template includes a stencil that maps a given type in the model to a particular shape in the diagram.

3. The method of claim 1, wherein the template defines a mapping between the properties of elements of model to properties of shapes on the diagram.

4. The method of claim 1, wherein the system also interacts with a user to edit the diagram.

5. The method of claim 1, wherein the system parses the description file to determine fragments that correspond to one or more objects of the diagram.

6. The method of claim 5, wherein the system stores the fragments with the model.

7. The method of claim 5, wherein the system reassembles the fragments to re-create the diagram.

8. A product data management (PDM) data processing system, comprising:
   at least one processor; and
   an accessible memory, wherein the PDM data processing system is configured to:
   receive a PDM model;
   apply a template to the model;
   create a description file based on the application of the template to the model; and
   transfer the description file to a diagramming application, wherein a diagram corresponding to the description file is created.

9. The PDM data processing system of claim 8, wherein the template includes a stencil that maps a given type in the model to a particular shape in the diagram.

10. The PDM data processing system of claim 8, wherein the template defines a mapping between the properties of elements of model to properties of shapes on the diagram.

11. The PDM data processing system of claim 8, further configured to interact with a user to edit the diagram.

12. The PDM data processing system of claim 8, further configured to parse the description file to determine fragments that correspond to one or more objects of the diagram.

13. The PDM data processing system of claim 12, further configured to store the fragments with the model.

14. The PDM data processing system of claim 12, further configured to reassemble the fragments to re-create the diagram.

15. A non-transitory computer-readable medium encoded with executable instructions that, when executed, cause a product data management (PDM) data processing system to:
   receive a PDM model;
   apply a template to the model;
   create a description file based on the application of the template to the model; and
   transfer the description file to a diagramming application, wherein a diagram corresponding to the description file is created.

16. The computer-readable medium of claim 15, wherein the template includes a stencil that maps a given type in the model to a particular shape in the diagram.

17. The computer-readable medium of claim 15, wherein the template defines a mapping between the properties of elements of model to properties of shapes on the diagram.

18. The computer-readable medium of claim 15, wherein the instructions cause the PDM data processing system to interact with a user to edit the diagram.

19. The computer-readable medium of claim 15, wherein the instructions cause the PDM data processing system to parse the description file to determine fragments that correspond to one or more objects of the diagram.

20. The computer-readable medium of claim 19, wherein the instructions cause the PDM data processing system to store the fragments with the model.

21. The computer-readable medium of claim 19, wherein the instructions cause the PDM data processing system to reassemble the fragments to re-create the diagram.

* * * * *